(12) United States Patent
Shin et al.

(10) Patent No.: US 7,405,626 B2
(45) Date of Patent: Jul. 29, 2008

(54) DISTRIBUTED AMPLIFIER HAVING A VARIABLE TERMINAL RESISTANCE

(75) Inventors: Shih-Chieh Shin, Taipei (TW); Ming-Da Tsai, Taipei (TW); Huei Wang, Taipei (TW)

(73) Assignee: National Taiwan University, Taipei (TW)

( * ) Notice: Subject to any disclaimer, the term of this patent is extended or adjusted under 35 U.S.C. 154(b) by 27 days.

(21) Appl. No.: 11/603,222

(22) Filed: Nov. 22, 2006

(65) Prior Publication Data

US 2008/0030278 A1    Feb. 7, 2008

(30) Foreign Application Priority Data

Aug. 1, 2006    (TW) ............................... 95128158 A

(51) Int. Cl.
*H03F 3/60*    (2006.01)
(52) U.S. Cl. ...................................... 330/286; 330/296
(58) Field of Classification Search .................. 330/54, 330/285, 286, 296
See application file for complete search history.

(56) References Cited

U.S. PATENT DOCUMENTS

| 5,365,197 | A | * | 11/1994 | Ikalainen | ..................... | 330/286 |
| 5,831,476 | A | * | 11/1998 | Buer et al. | ..................... | 330/2 |
| 6,433,640 | B1 | * | 8/2002 | Pavio et al. | ................. | 330/295 |
| 6,674,329 | B1 | * | 1/2004 | Stengel et al. | ............... | 330/286 |

* cited by examiner

*Primary Examiner*—Henry K Choe
(74) *Attorney, Agent, or Firm*—Birch, Stewart, Kolasch & Birch, LLP

(57) ABSTRACT

A distributed amplifier is disclosed herein, which includes a signal amplification unit amplifying a RF input signal fed into the RF signal, a first biasing circuit providing a direct current (DC) bias signal, a second biasing circuit providing a DC bias signal, the variable terminal resistance providing an adjustable resistance, a RF signal input terminal provided for input of the RF input signal and a RF signal output terminal for output of a RF output signal. The output RF signal from the distributed amplifier is obtained from a gained version of the input RF signal. Since a load mismatch issue is compensated, a gain flatness issue is considerably improved and thus a gain-adjustable range is increased with respect to the distributed amplifier.

16 Claims, 5 Drawing Sheets

DISTRIBUTED AMPLIFIER HAVING A VARIABLE TERMINAL RESISTANCE

BACKGROUND OF THE INVENTION

1. Field of the Invention

The present invention relates generally to a distributed amplifier having a variable terminal resistance, and in particular to a distributed amplifier having a variable terminal resistance, in which a load resistance of a signal amplification unit thereof may be adjusted to achieve the optimal resistance matching so as to obtain a good gain flatness.

2. The Prior Arts

FIG. 1 is a circuit diagram of a conventional distributed amplifier. The distributed amplifier comprises a signal amplification unit A, a first biasing circuit B, a second biasing circuit C, a terminal resistance D, a radio frequency (RF) signal input terminal E and a RF signal output terminal F. The signal amplification unit A is used to amplify a RF input signal fed at the RF signal input terminal E. The first biasing circuit B is used to provide a direct current (DC) bias at a base of a transistor A1. The second biasing circuit C is used to provide a DC bias at a collector of the transistor A1. The terminal resistance D is used to provide a resistance matching with an output resistance of the distributed amplifier. As also mentioned above, the RF signal input terminal E is used for a RF signal input. The RF output terminal F is used for a RF signal output.

In the above distributed amplifier, the signal amplification unit A has a plurality of transistors A1, a first external inductor A2, a second external inductor A3, a third external inductor A4 and a fourth external inductor A5. In the signal amplification unit A, the first external inductor A2 is electrically connected to a base of the transistor A1. The base of the transistor A1 is electrically connected to a base of a next transistor A1 via a coupling inductor L. In this manner, the next transistor A1 is further electrically connected to its next transistor A1 at their bases via another coupling inductor L, and the final transistor A1 is electrically connected to the second external inductor A3 at the base. Meanwhile, the third external inductor A4 is electrically connected to the collector of the transistor A1. The transistor A1 is electrically connected to its next transistor A1 at their collectors via another coupling inductor L. In this manner, the next transistor A1 is electrically connected to the collector of its next transistor A1 at its collector via another coupling inductor L and the final transistor A1 is electrically connected to the fourth inductor A5 at its collector. The first bias circuit B is electrically connected to the second external inductor A3. The terminal resistance D is electrically connected to the third external inductor A4. The second bias circuit C is electrically connected to the external resistance D. The RF signal input terminal E is electrically connected to the first external inductor A2. The RF signal output terminal F is connected to the fourth external inductor A5 via the fourth inductor A4.

The terminal resistance of the distributed amplifier has a constant value, which does not always match with the output resistance of the signal amplification unit since the output resistance will vary as the DC bias voltage of the signal amplification unit is changed so as to achieve a different gain. This can adversely affect the gain flatness provided by the distributed amplifier.

In light of the demerits encountered in the prior art, the inventor of the present invention sets forth a distributed amplifier in which a variable terminal resistance is provided for resistance matching to improve the fain flatness issue.

SUMMARY OF THE INVENTION

It is, therefore, an object of the present invention to provide a distributed amplifier which can achieve a resistance matching effect with respect to different bias voltages by using a variable terminal resistance and thus improve a gain flatness.

It is another object of the present invention to provide a distributed amplifier which can achieve a resistance matching effect with respect to different gains by adjusting a variable terminal resistance so as to improve a gain flatness and thus increase a gain-adjustable range.

According to the present invention, the distributed amplifier comprises a signal amplification unit having an output resistance, a radio frequency (RF) signal input terminal provided for input of a RF input signal to the signal amplification unit, a RF output terminal provided for output of a RF output signal from the signal amplification unit, a first biasing circuit providing a direct current (DC) bias signal to the signal amplification unit, a variable terminal resistance having a first end and a second end and providing a variable resistance to match with an output resistance of the signal amplification unit, and a second biasing circuit providing another DC bias signal to the variable terminal resistance, wherein the RF input signal is provided with a gain by the signal amplification unit and the RF output signal is generated from the signal amplification unit, and the variable resistance is selected to match with the output resistance of the signal amplification unit.

With use of the present invention, since the resistance matching effect is achieved, an improved gain flatness is obtained and thus an increased gain-adjustable range is also secured.

Other features of the present invention will become more apparent from the detailed description provided below.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENT

The present invention will be described in detail with reference to the drawings.

Figure 1:
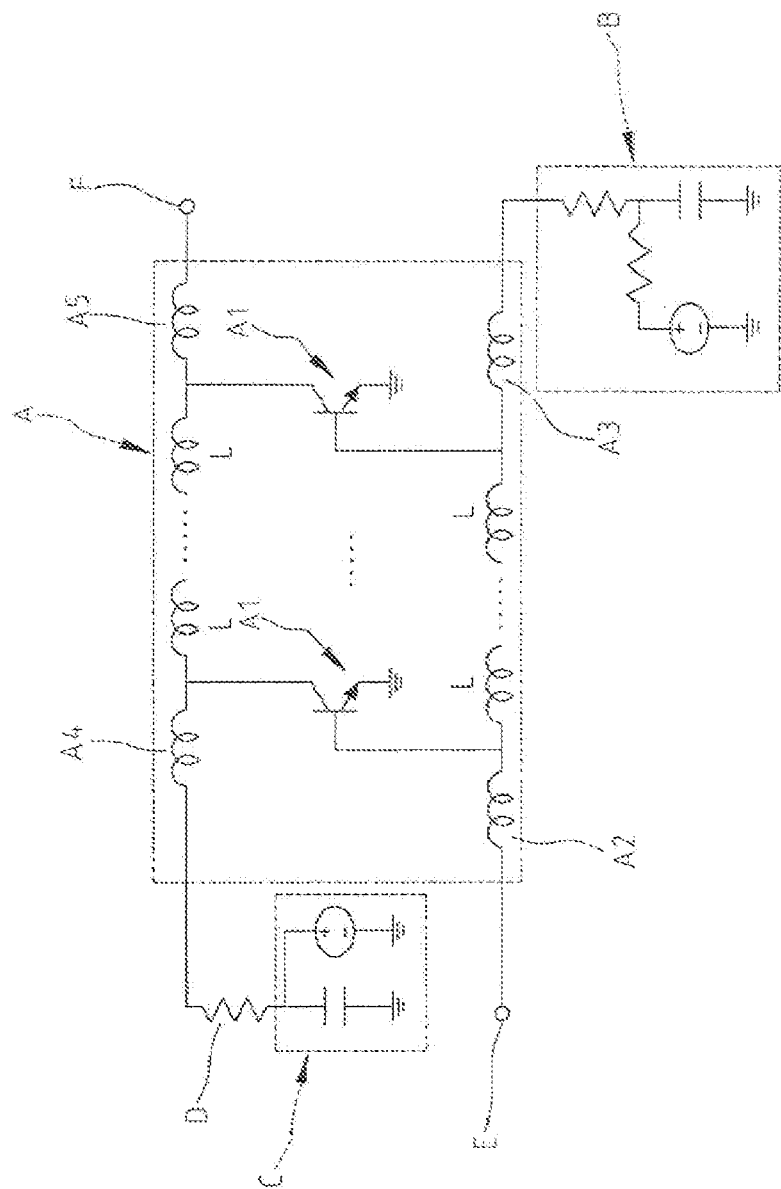
FIG. 1 is a circuit diagram of a conventional distributed amplifier.
Figure 2:
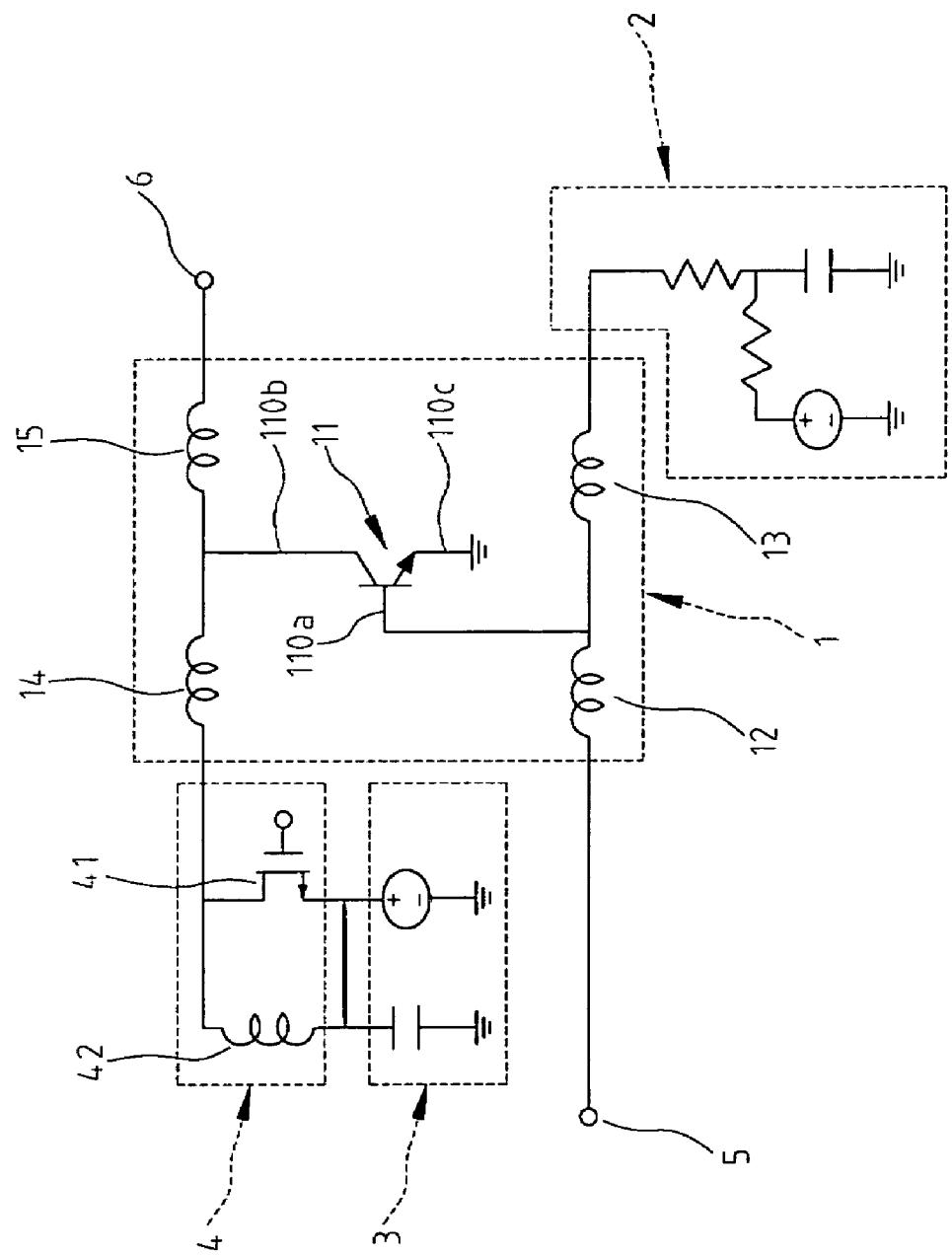
FIG. 2 is a circuit diagram of a distributed amplifier according to a first embodiment of the present invention.

Referring to FIG. 2, a circuit diagram of a distributed amplifier having a variable terminal resistance according to a first embodiment of the present invention is shown therein. The distributed amplifier 100 comprises a signal amplification unit 1, a first biasing circuit 2, a second biasing circuit 3, a variable terminal resistance 4, a RF signal input terminal 5 and a RF signal output terminal 6. The signal amplification unit 1 is used to amplify an input signal fed into the RF signal input terminal 5. The first biasing circuit 2 is used to provide a direct current (DC) bias signal. The second biasing circuit 3 is used to provide a DC bias signal. The variable terminal resistance 4 is disposed for providing an adjustable resistance so that a resistance matching may be achieved with respect to an output resistance of the signal amplification unit 1. The RF signal input terminal 5 is provided for input of a RF input signal. The RF signal output terminal 6 is provided for output of a RF output signal. In this configuration, the RF input signal fed from the RF signal input terminal 5 may be adjusted with a gain and then outputted at the RF signal output terminal 6. Meanwhile, load mismatching appeared in the prior art, where no variable terminal resistance is presented, can be compensated. Correspondingly, the distributed amplifier can have a considerably improved gain flatness, thereby increasing a gain-adjustable range.

In the distributed amplifier 100, the signal amplification unit 1 has an active device 11, a first external inductor 12, a second external inductor 13, a third external inductor 14 and a fourth external inductor 15. The variable terminal resistance 4 has a resistance adjusting transistor 41 and a bypass inductor 42 therein. The resistance adjusting transistor 41 is operable in a triode region and provides a variable resistance by varying a voltage fed to a gate thereof. In the signal amplification unit 1, the first and second external inductors 12, 13 are electrically connected to an input terminal 110a of the active device 11, respectively. The third and fourth external inductors 14 are electrically connected to an output terminal 110b of the active device 11, respectively. The active device 11 also has a ground terminal 110c, which is connected to ground. Further, in the variable terminal resistance 4, the resistance adjusting transistor 41 and the by-pass inductor 42 are connected in parallel with each other. The variable terminal resistance 4 has an end electrically connected to the third external inductor 14 and the other end electrically connected to the second biasing circuit 3. The first biasing circuit 2 is electrically connected to the second external inductor 13. The second biasing circuit 3 is electrically connected to the variable terminal resistance 4. The RF signal input terminal 5 is electrically connected to the first external inductor 12. The RF signal output terminal 6 is electrically connected to the fourth external inductor 15.

Specifically, the active device 11 may be a bipolar transistor. In this case, the input terminal 110a, output terminal 110b and ground terminal 110c are a base, collector and emitter of the bipolar transistor 11, respectively. Alternatively, the active device 11 may also be a field effect metal oxide semiconductor (MOS) transistor. In this case, the input terminal 11a, output terminal 110 and ground terminal 110c are a gate, a drain and a source of the field effect MOS transistor, respectively.

In the first embodiment of the distributed amplifier, when a RF input signal is fed into the distributed amplifier 100 via the RF signal input terminal 5, the first biasing circuit 2 adds a DC bias signal to the RF input signal. Then, the biased RF input signal is inputted into the signal amplification unit 1 and a gained RF signal is correspondingly generated therefrom. Meanwhile, the second biasing circuit 3 also outputs a DC bias signal to the signal amplification unit 1. Thus, the gained RF signal from the signal amplification unit 1 is biased with the DC bias signal associated with the second biasing circuit 3 and then outputted at the RF signal output terminal 6. In the above, the by-pass inductor 42 provides a high resistance when being operated in a specific frequency range. The resistance adjusting transistor 41 is operated in the triode region and provides a specific resistance when the specific frequency range is involved. To match with the output resistance of the signal amplification unit 1, the resistance provided by the variable terminal resistance 4 can be adjusted by varying a voltage appeared on a gate of the resistance adjusting transistor 41. In this manner, a resistance matching issue between the variable terminal resistance 4 and the signal amplification unit 1 can be compensated. Thus, the outputted RF signal from the distributed amplifier 100 at the RF signal output terminal 6 has an improved gain flatness and an increased gain-adjustable range, as compared to the prior art. Additionally, it is to be noted that each of the inductors 12, 13, 14, 15, 42 mentioned above may be implemented with at least a micro-stripe having an equivalent inductance with respect thereto or at least a lumped device having an equivalent inductance with respect thereto.

Figure 3:
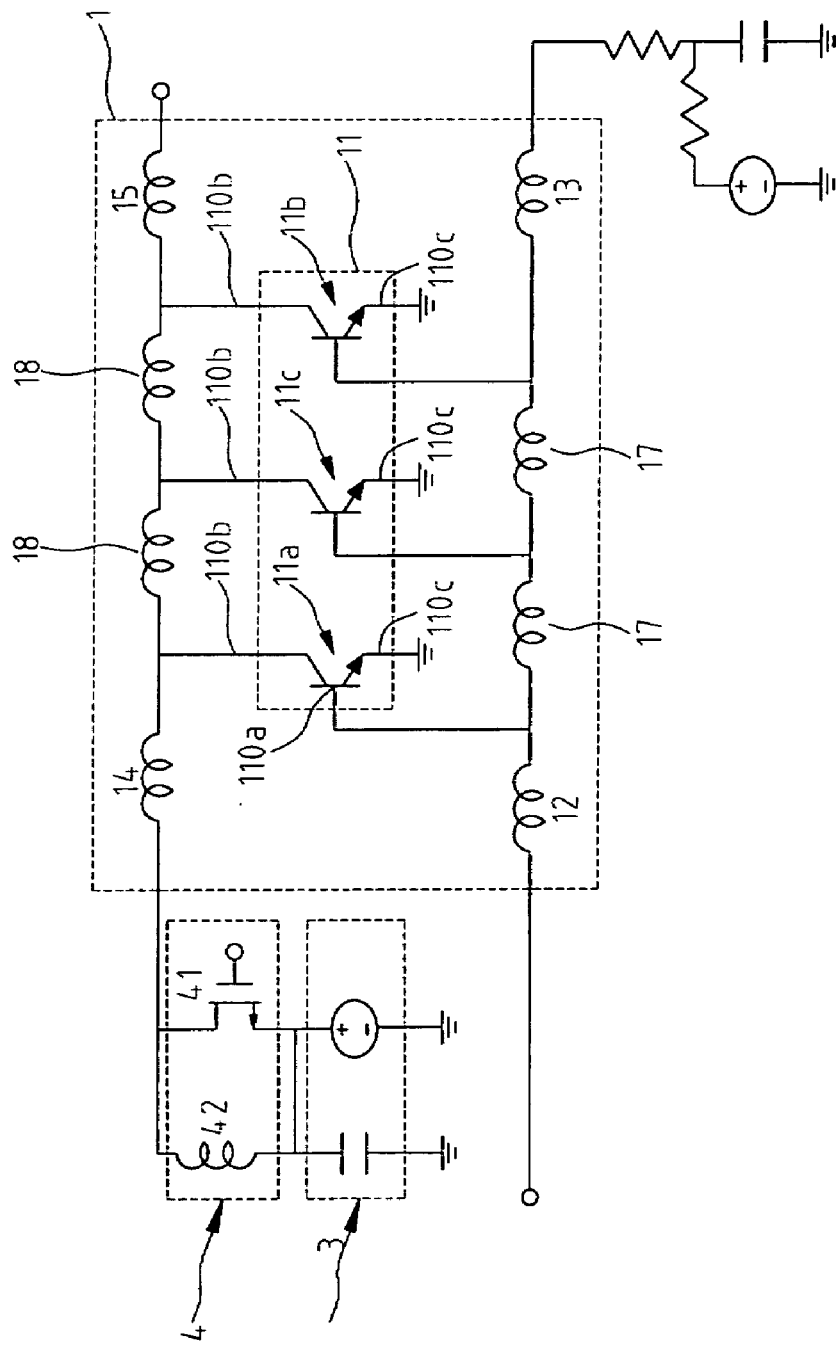
FIG. 3 is a circuit diagram of a distributed amplifier according to a second embodiment of the present invention.

Referring to FIG. 3, a circuit diagram of the distributed amplifier according to a second embodiment of the present invention is shown therein. In this embodiment, the active device 11 in the signal amplification unit 1 is composed of a plurality of sub-active devices, a first sub-active device 11a, a second sub-active device 11b and a third sub-active device 11a in the drawing. Although three sub-active devices are illustrated in the drawing, the sub-active devices may have any number greater than one, such as two and seven. In this case, a first inductor 17 and a second inductor 18 are connected between two adjacent sub-active devices 110a and 110b or 110b and 110c. The first active device 11a has an input terminal 110a electrically connected to the first external inductor 12 and an output terminal 110b electrically connected to the third external inductor 14. The second active device 11b has an input terminal 110a electrically connected to the second external inductor 13 and an output terminal 110b electrically connected to the fourth external inductor 15. The third active device 11c has an input terminal 11a electrically connected to the input terminal 110a of the first active device 11a via a first coupling inductor 17 and electrically connected to the input terminal 110a of the second active device 11b via another coupling inductor 17. The output terminal 110b of the third active device 11c is electrically connected to the output terminal 110b of the first active device 11a via the second coupling inductor 18 and electrically connected to the output terminal 110b of the second active device 11b via another second coupling inductor 18, respectively. The first, second and third active device 11a, 11b and 11c are connected in parallel with one another. Similarly, each of the sub-active devices 11a, 11b and 11c may be a bipolar transistor or a field effect MOS transistor. By varying the number of the sub-active devices 11 or the DC bias signals of the first and second biasing circuits 2, 3, the signal amplification unit 1 may provide a variable gain. In addition, the variable terminal resistance 4 may be provided to match with the output resistance of the signal amplification unit 1 for the improved gain flatness and thus the wide gain-adjustable range purposes. By delicately adjusting the gate voltage of the resistance adjusting transistor 41, these purposes can be well achieved.

Figure 4:
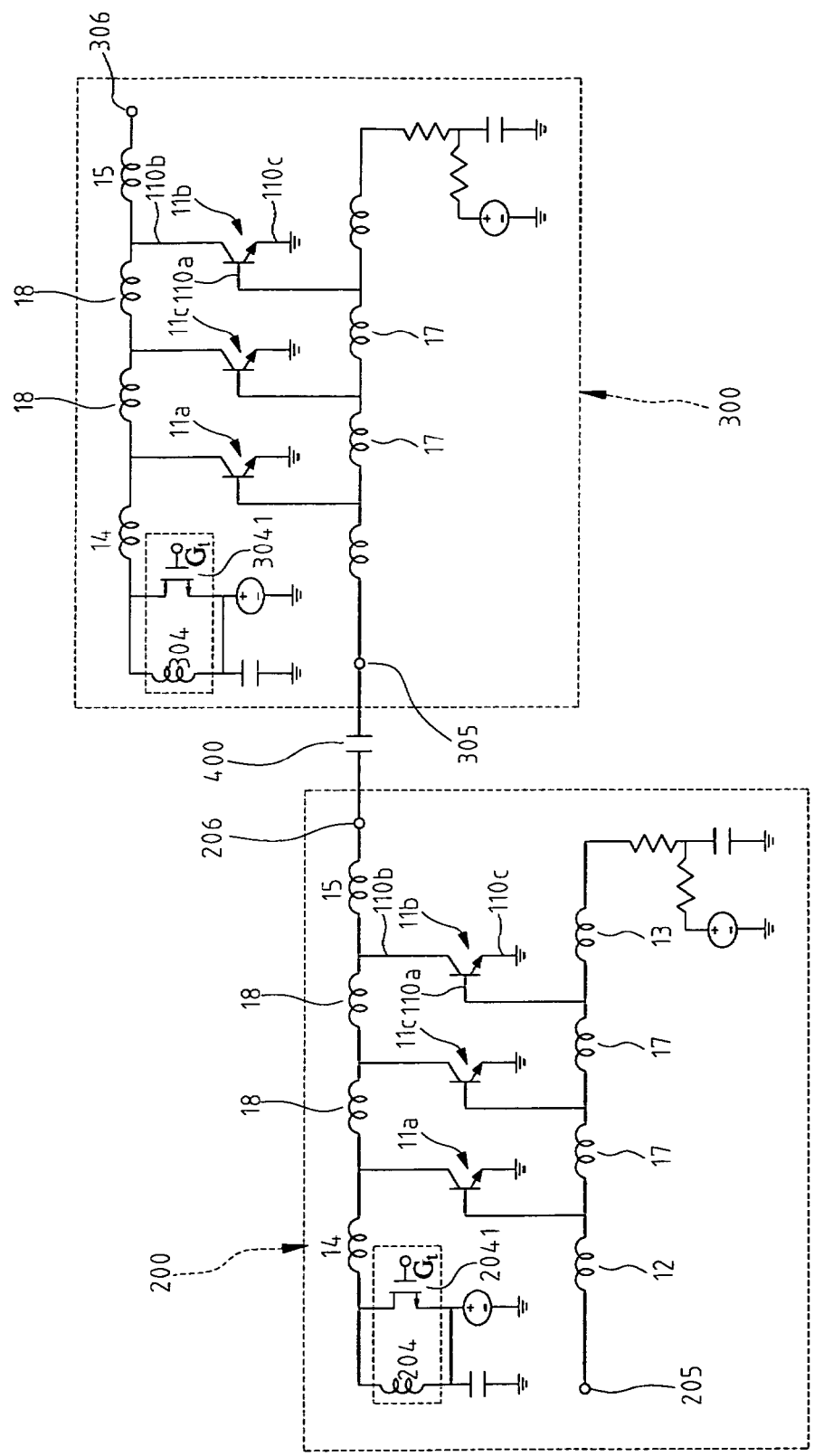
FIG. 4 is a circuit diagram of a distributed amplifier according to a third embodiment of the present invention.

Referring to FIG. 4, a circuit diagram of the distributed amplifier according to a third embodiment of the present invention is shown therein. In this embodiment, a plurality of thus-constructed distributed amplifiers are coupled in series to form a distributed amplifier with multiple-stage amplifiers, in which a block capacitor 400 is provided between each two adjacent single stage distributed amplifiers 200, 300. It is to be noted that the block capacitor 400 may be implemented with at least a micro-stripe having an equivalent capacitance with respect thereto or at least a lumped device having an equivalent capacitance with respect thereto. In the drawing, the distributed amplifier is depicted as a two-stage form, but other stage number may also be contemplated. Herein, the two stages 200, 300 are termed as a first stage distributed amplifier 200 and a second stage distributed amplifier 300, respectively. Assuming now a RF input signal is fed into the distributed amplifier at the RF input terminal 205 of the first stage distributed amplifier 200. The RF output signal of the first stage will be served as a RF input signal with respect to the second stage distributed amplifier 300. Before entering the second stage amplifier 300, the RF input signal of the second stage distributed amplifier 300 has to pass through the block capacitor 400, the block capacitor 400 being provided to avoid interference between the DC bias signals associated with the two stage distributed amplifiers 200, 300. With this multi-stage design, the gain adjustment issue becomes more flexible and thus the distributed amplifier may find more applications.

Figure 5:
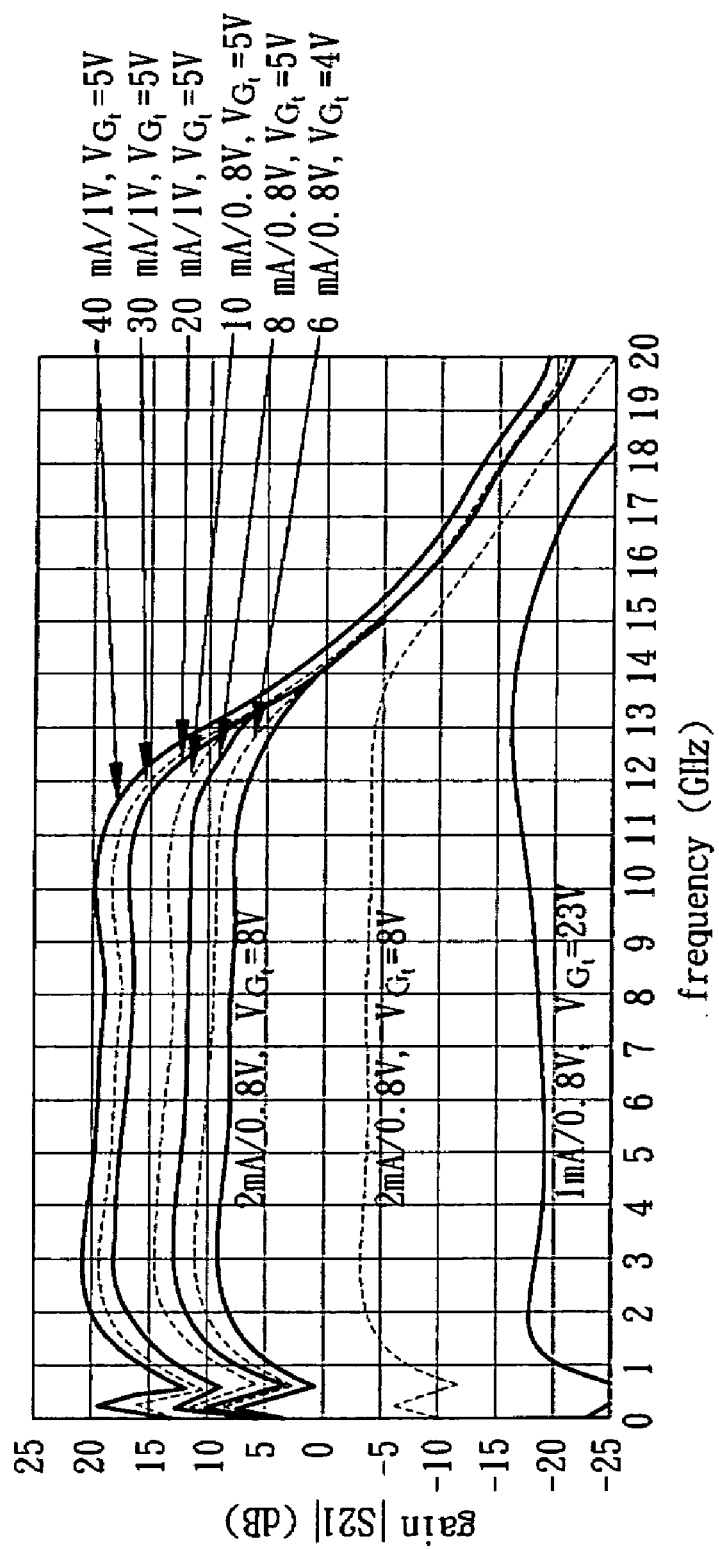
FIG. 5 is a relationship plot illustrating a gain as a function of frequency with respect to the distributed amplifier shown in FIG. 4.

FIG. 5 is a relationship plot illustrating gain as a function of frequency with respect to the distributed amplifier shown in FIG. 4. Referring to FIG. 4 and FIG. 5, when different bias signals are provided to the two stages 200, 300 of the distributed amplifier shown in FIG. 4, different gains can be achieved over a wide range of frequency band. Since the first and second stage distributed amplifiers 200, 300 are operated with different bias signals, different resistances are observed with respect to the first and second stage distributed amplifiers 200, 300. On the other hand, the resistance matching issue discussed with respect to FIG. 2 and FIG. 3 are also required to be kept. At this time, the respective gate voltages $V_{Gt1}$ and $V_{Gt2}$ of the resistance adjusting transistors 2041, 3041 of the variable terminal resistances 204, 304 in the first and second stage distributed amplifiers 200, 300 have to be adjusted, respectively, so that each of the variable terminal resistances 204, 304 can provide a resistance matching with the output resistance of the associated stage 200 or 300. Since the resistance matching is respectively achieved in the first and second stage distributed amplifiers 200, 300, a gain variation for each gain over different frequencies is allowed to be limited within 1 dB, shown in FIG. 5. In the illustrative figure, each gain is obtained by providing the same gate voltage $V_{Gt}$ to the resistance adjusting transistors in the first and second stage distributed amplifiers, and each bias signal for the respective gain among the gains shown is presented in the voltage and current form.

In conclusion, different gains may be achieved by using the distributed amplifier of this invention by providing different biasing circuits and thus different DC bias signals. The output resistance varied owing to the gain shift can be matched with by adjusting the variable terminal resistance, which are true in the single and multiple stage distributed amplifier cases.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A distributed amplifier, comprising:
    a signal amplification unit having an output resistance;
    a RF signal input terminal provided for input of a RF input signal to the signal amplification unit; and
    a RF output terminal provided for output of a RF output signal from the signal amplification unit;
    a first biasing circuit providing a direct current (DC) bias signal to the signal amplification unit;
    a variable terminal resistance having a first end and a second end and providing a variable resistance to match with an output resistance of the signal amplification unit; and
    a second biasing circuit providing another DC bias signal to the variable terminal resistance,
    wherein the RF input signal is provided with a gain by the signal amplification unit and the RF output signal is generated from the signal amplification unit, and the variable resistance is selected to match with the output resistance of the signal amplification unit.

2. The distributed amplifier as claimed in claim 1, wherein the signal amplification unit comprises:
    an active device having an input terminal, an output terminal and a ground terminal;
    a first external inductance;
    a second external inductance;
    a third external inductor; and
    a fourth external inductor
    wherein the first external inductor is electrically connected to the input terminal of the active device, the second external inductor is electrically connected to the input terminal of the active device, the third external inductor is electrically connected to the output terminal of the active device, the fourth external inductor is electrically connected to the output terminal of the active device, the ground terminal of the active device is connected to a ground, the first end of the variable terminal resistance is electrically connected to the third external inductor and the second end is electrically connected to the second biasing circuit, the first biasing circuit is electrically connected to the second external inductor, the RF signal input terminal is electrically connected to the first external inductor, and the RF signal output terminal is electrically connected to the fourth external inductor.

3. The distributed amplifier as claimed in claim 1, wherein the active device is a bipolar transistor, and the input terminal, output terminal and ground terminal are a base, a collector and an emitter of the bipolar transistor, respectively.

4. The distributed amplifier as claimed in claim 1, wherein the variable terminal resistance further comprises a resistance adjusting transistor and a by-pass inductor, wherein the resistance adjusting transistor is operated in a triode region and provides a specific resistance by varying a voltage on a gate thereof, whereby the variable resistance is selected.

5. The distributed amplifier as claimed in claim 4, wherein each of the first, second, third, fourth and by-pass inductors is one of at least micro-stripe device having an equivalent inductance with respect thereto and at least a lumped device having an equivalent inductance with respect thereto.

6. The distributed amplifier as claimed in claim 5, wherein the distributed amplifier is further electrically connected to at least an additional distributed amplifier as claimed in claim 1, wherein a block capacitor is electrically connected between each two adjacent ones of the distributed amplifier and the at least an additional distributed amplifier.

7. The distributed amplifier as claimed in claim 6, wherein the block capacitor is one of at least a micro-stripe device having an equivalent capacitance with respect thereto and at least a lumped device having an equivalent capacitance with respect thereto.

8. The distributed amplifier as claimed in claim 7, wherein the active device is a bipolar transistor, and the input terminal, output terminal and ground terminal are a base, a collector and an emitter of the bipolar transistor, respectively.

9. The distributed amplifier as claimed in claim 1, wherein the active device is a field effect metal oxide semiconductor (MOS) transistor, and the input terminal, output terminal and ground terminal are a gate, a drain and a source thereof.

10. The distributed amplifier as claimed in claim 1, wherein the signal amplification unit further comprises a plurality of sub-active devices connected in parallel with each other from a first one to a final one and each having an input terminal, an output terminal and a ground terminal, a plurality of first coupling inductors and a plurality of second coupling inductors, wherein the first external inductor is electrically connected to the input terminal of the first one of the plurality of sub-active devices, the second external inductor is electrically connected to the input end of the final one of the plurality of sub-active devices, the third external inductor is electrically connected to the output terminal of the first one of the plurality of sub-active devices, the fourth external inductor is electrically connected to the output terminal of the final one of the plurality of sub-active devices, the ground terminal of each of the plurality of sub-active devices is connected to a ground, each of the plurality of first coupling inductors is electrically connected between the input terminals of each two adjacent ones of the plurality of sub-active devices, and each of the plurality of second coupling inductors is electrically connected between the output terminals of each two adjacent ones of the plurality of sub-active devices.

11. The distributed amplifier as claimed in claim 10, wherein each of the sub-active devices is a bipolar transistor, and the input terminal, output terminal and ground terminal are a base, a collector and an emitter of the bipolar transistor, respectively.

12. The distributed amplifier as claimed in claim 10, wherein each of the sub-active devices is a field effect MOS transistor, and the input terminal, output terminal and ground terminal are a gate, a drain and a source of the field effect MOS transistor.

13. The distributed amplifier as claimed in claim 10, wherein the variable terminal resistance further comprises a resistance adjusting transistor and a by-pass inductor, wherein the resistance adjusting transistor is operated in a triode region and provides a specific resistance by varying a voltage on a gate thereof.

14. The distributed amplifier as claimed in claim 10, wherein each of the first, second, third, fourth and by-pass inductors is one of at least a micro-stripe device having an equivalent inductance with respect thereto and at least a lumped device having an equivalent inductance with respect thereto.

15. The distributed amplifier as claimed in claim 10, wherein the distributed amplifier is further electrically connected to at least an additional distributed amplifier as claimed in claim 1, wherein a block capacitor is electrically connected between each two adjacent ones of the distributed amplifier and the at least an additional distributed amplifier.

16. The distributed amplifier as claimed in claim 15, wherein the block capacitor is one of at least a micro-stripe device having an equivalent capacitance with respect thereto and at least a lumped device having an equivalent capacitance with respect thereto.

* * * * *